United States Patent
Madni

(10) Patent No.: US 6,747,512 B2
(45) Date of Patent: Jun. 8, 2004

(54) AMPLIFIER AND TUNER

(75) Inventor: Arshad Madni, Swindon (GB)

(73) Assignee: Zarlink Semiconductor Limited, Wiltshire (GB)

( * ) Notice: Subject to any disclaimer, the term of this patent is extended or adjusted under 35 U.S.C. 154(b) by 0 days.

(21) Appl. No.: 10/383,712

(22) Filed: Mar. 7, 2003

(65) Prior Publication Data

US 2003/0179038 A1 Sep. 25, 2003

(30) Foreign Application Priority Data

Mar. 12, 2002 (GB) .............................................. 0205699

(51) Int. Cl.[7] .................................................. H03F 3/45
(52) U.S. Cl. ...................................... 330/69; 330/124 R
(58) Field of Search .......................... 330/69, 149, 109, 330/124 R, 252, 258, 260; 327/359

(56) References Cited

U.S. PATENT DOCUMENTS

| | | | |
|---|---|---|---|
| 5,300,896 A | * | 4/1994 | Suesserman ................ 330/260 |
| 6,392,477 B2 | * | 5/2002 | Yamashita ................... 330/69 |
| 6,396,343 B2 | * | 5/2002 | Chee ........................... 330/69 |
| 6,515,542 B1 | * | 2/2003 | Wang et al. .................. 330/69 |

FOREIGN PATENT DOCUMENTS

| | | |
|---|---|---|
| EP | 0 716 504 | 11/1995 |
| EP | 0 716 505 | 6/1996 |
| GB | 2 223 902 | 10/1988 |

OTHER PUBLICATIONS

Search Report regarding corresponding Application No. GB 0205699.2 dated Apr. 15, 2002.

* cited by examiner

*Primary Examiner*—Henry Choe
(74) *Attorney, Agent, or Firm*—Renner, Otto, Boisselle & Sklar, LLP

(57) ABSTRACT

An amplifier which is suitable for use as a radio frequency low noise amplifier comprises first, second and third transconductance stages. The amplifier input is connected to the inputs of the first and third stages, whose outputs are connected together in anti-phase so as to provide feedforward error correction. The second stage has inputs connected to the outputs of the first stage and outputs connected across a resistor to current feedback inputs of the first stage so as to provide negative feedback. The first and third stages provide feedforward distortion cancelling so as to improve the linearity of the amplifier. The negative feedback provided by the second stage further improves the linearity without substantially increasing the noise figure of the amplifier.

16 Claims, 3 Drawing Sheets

AMPLIFIER AND TUNER

TECHNICAL FIELD

The present invention relates to an amplifier, for example for use at radio frequencies as a low noise amplifier (LNA) in a tuner. The present invention also relates to a tuner including such an amplifier.

BACKGROUND

EP 0 716 505 discloses an LNA comprising first and second transconductance stages and a series feedback arrangement. The first transconductance stage amplifies the radio frequency input signal whereas the second stage is in a negative feedback loop of the first stage. In particular, the input of the second stage is connected to the output of the first stage whereas the output of the second stage is connected to a series feedback resistor of the first stage. This has the effect of increasing feedback around the first stage, and hence reducing distortion, while maintaining a good noise figure.

SUMMARY

According to a first aspect of the invention, there is provided an amplifier comprising: an amplifier input; an amplifier output; a first transconductance stage having a first input connected to the amplifier input, a current feedback input, and a first output connected to the amplifier output; a second transconductance stage having a second input connected to the amplifier output and a second output connected to the current feedback input to provide negative feedback; and a third transconductance stage having a third input connected to the amplifier input and a third output connected to the amplifier output to provide feedforward error correction.

The amplifier may comprise a radio frequency amplifier, such as a low noise amplifier.

The amplifier may comprise a load connected to the amplifier output.

Each of the first, second and third transconductance stages may comprise a differential transconductance stage having differential inputs and outputs.

The first transconductance stage may comprise first and second transistors whose input terminals comprise the first input, whose output terminals comprise the first output, and whose common terminals comprise the current feedback input. A first resistance may be connected between the common terminals of the first and second transistors. As an alternative, the common terminals of the first and second transistors may be connected via respective second resistances to a first current source.

Where the transistors are bipolar transistors, the input, output and common terminals are the base, collector and emitter terminals, respectively. Where the transistors are field effect transistors, the input, output and common terminals are the gate, drain and source terminals, respectively.

The second transconductance stage may comprise third and fourth transistors whose input terminals comprise the second input and whose output terminals comprise the second output. The common terminals of the third and fourth transistors may be connected via respective third resistances to a power supply line. The third and fourth transistors may be of the same conductivity type as the first and second transistors. As an alternative, the common terminals of the third and fourth transistors may be connected via respective fourth resistances to a second current source. The third and fourth transistors may be of a conductivity type opposite that of the first and second transistors.

The third transconductance stage may comprise fifth and sixth transistors whose control terminals comprise the third input and whose output terminals comprise the third output. The common terminals of the fifth and sixth transistors may be connected via respective fifth resistances to a third current source. The input terminals of the first and second transistors may be connected to the input terminals of the fifth and sixth transistors, respectively, and the output terminals of the first and second transistors may be connected to the output terminals of the sixth and fifth transistors, respectively.

According to a second aspect of the invention, there is provided a tuner including an amplifier according to the first aspect of the invention.

It is thus possible to provide an amplifier which is suitable for use at radio frequencies and which provides improved linearity while maintaining a low noise figure. These improvements are obtained by providing a combination of feedforward error correction and feedback so that the distortion performance is improved without compromising the noise figure.

BRIEF DESCRIPTION OF DRAWINGS

Like reference numerals refer to like parts throughout the drawings.

DETAILED DESCRIPTION

Figure 1:
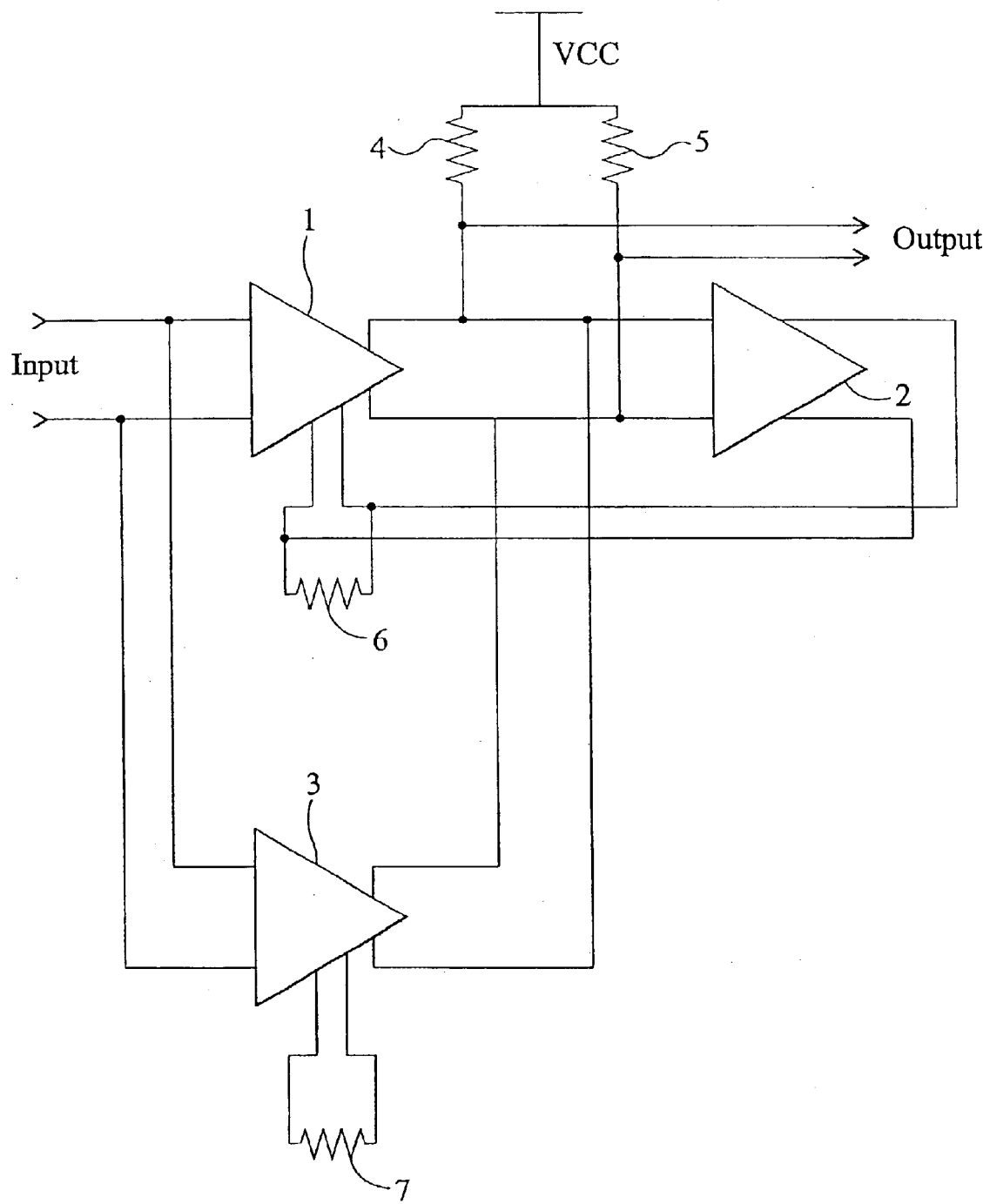
FIG. 1 is a block circuit diagram of an amplifier constituting an embodiment of the invention.

The amplifier shown in FIG. 1 is of the differential type and is suitable, for example, for use as a low noise amplifier (LNA) at radio frequencies in the input arrangement of a radio frequency tuner. The amplifier comprises first, second and third transconductance stages 1, 2 and 3.

The first transconductance stage 1 has differential inputs connected to the differential amplifier input and differential outputs connected to the differential amplifier output. The outputs of the first stage 1 are also connected via respective load resistors 4 and 5 to a supply line vcc. Each of the resistors 4 and 5 has a resistance R1. The first stage has current feedback inputs between which is connected a resistor 6 of resistance Re.

The second stage 2 has differential inputs connected to the differential outputs of the first stage 1 and to the amplifier output. The second stage 2 has differential outputs which are connected across the resistor 6 to the current feedback inputs of the first stage 1 in a sense so as to provide current negative feedback.

The third stage 3 has differential inputs connected to the amplifier input and differential outputs connected to the differential outputs of the stage 1 and the amplifier output. The transconductance paths of the first and third stages 1 and 3 are connected in parallel but in a sense which provides feedforward error correction. In particular, the contribution provided by the third stage 3 is effectively subtracted from the contribution provided by the first stage 1, which provides the dominant transconductance of the amplifier. The third stage 3 also has connections to a resistor 7 which, like the resistor 6, participates in determining the transconductance of the stage. In the particular example described hereinafter, the resistance of the resistor 7 is twenty times that of the resistor 6, i.e. 20 Re. The stages 1 and 3 also have internal resistances, such as diode resistances of transistors of the stages, which also participate in determining the transconductances of the stages. In the example described hereinafter, the internal resistance of the stage 1 has a value of re and that of the stage 3 is twenty times the value, i.e. 20 re.

The transfer function (output/input) of the first stage 1 and the load resistors 4 and 5 is given by:

$$\frac{\text{Output}}{\text{Input}} = \frac{Rl}{(1 + gmf \cdot Rl)\text{Re} + re} \quad (1)$$

where gmf is the transconductance of the second stage 2 and R1, Re and re are as defined hereinbefore. The transfer function of the third stage 3 is given by:

$$\frac{\text{Output}}{\text{Input}} = \frac{Rl}{20re + 20\text{Re}} \quad (2)$$

The transfer function of the third stage 3 is of opposite polarity to that of the first stage 1 so that the transfer function of the whole amplifier is given by:

$$\frac{\text{Output}}{\text{Input}} = \frac{Rl}{(1 + gmf \cdot Rl)\text{Re} + re} - \frac{Rl}{\text{Re}20 + re20} \quad (3)$$

Equation (1) may be rewritten in cubic polynomial form as:

$$\frac{\text{Output}}{\text{Input}} = A \cdot vin - \alpha \cdot vin^3 \quad (4)$$

where $$A = \frac{Rl}{(1 + gmf \cdot Rl)\text{Re} + re}$$

vin is the input voltage and $\alpha$ is a nonlinear coefficient.

The equation (2) may be rewritten as a cubic polynomial in the same way so that the equation (3) may be rewritten as:

$$\frac{\text{Output}}{\text{Input}} = A \cdot vin - \alpha \cdot vin^3 - A_0 \cdot vin' + \alpha_1 \cdot vin^3 \quad (5)$$

where $$A_0 = \frac{Rl}{re20 + \text{Re}20}$$

and $\alpha_1$ is a nonlinear coefficient

The amplifier transfer function thus comprises a linear part having a coefficient $(A-A_0)$ and a third harmonic part having a coefficient $(\alpha_1-\alpha)$. By choosing the quiescent currents and values of the resistors 6 and 7, the third harmonic coefficient can be made zero whereas the linear coefficient remains finite. In particular, the value of $A_0$ can be made substantially less than the value of A so that the linear gain is only slightly less than A. Thus, feedforward error correction can be achieved in such a way that the third harmonic distortion is substantially eliminated or greatly reduced. The technique for selecting the component values and quiescent currents will be readily apparent to those skilled in the art and will not be described further.

As will be understood from examination of equation (1), the current negative feedback provided by the second stage 2 has the effect of increasing the value Re of the resistor 6 so that it is effectively (1+gmf.R1). However, with regard to noise contribution, the thermal noise remains that produced by the resistor 6. It is therefore possible to increase the level of feedback and hence to improve the linearity without substantially increasing the noise figure of the amplifier. It is therefore possible to achieve very high linearity, and hence very good distortion performance, while maintaining a very low noise figure.

Figure 2:
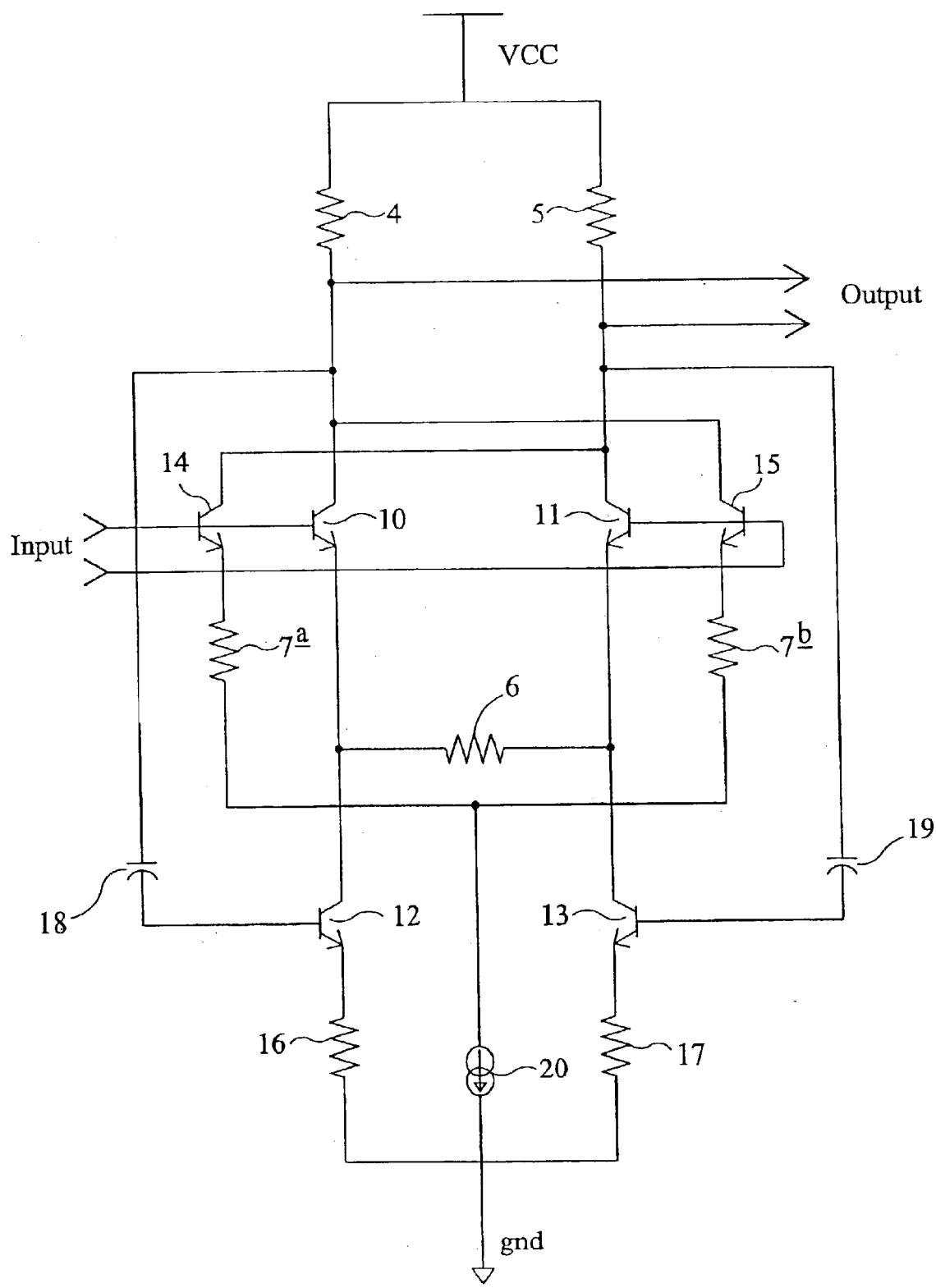
FIG. 2 is a circuit diagram of a first example of the amplifier shown in FIG. 1.

FIG. 2 illustrates an example of the amplifier shown in FIG. 1 embodied using NPN transistors 10 to 15. The first stage 1 comprises the differentially connected transistors 10 and 11 and the emitter degeneration resistor 6. The second stage 2 comprises the transistors 12 and 13, emitter degeneration resistors 16 and 17 connected between the emitters of the transistors 12 and 13, respectively, and ground gnd, and coupling capacitors 18 and 19 connecting the collectors of the transistors 10 and 11 to the bases of the transistors 12 and 13, respectively. The coupling capacitors 18 and 19 isolate the bases of the transistors 12 and 13 from the collectors of the transistors 10 and 11 at DC and biasing arrangements (not shown) are provided for appropriately biasing the transistors 12 and 13.

The third stage 3 comprises the transistors 14 and 15 whose emitters are connected via resistors 7a and 7b, which are equivalent to the resistor 7, to a constant current source 20. The bases of the transistors 14 and 15 are connected to the bases of the transistors 10 and 11, respectively, whereas the collectors of the transistors 14 and 15 are connected to the collectors of the transistors 11 and 10, respectively.

The collectors of the transistors 12 and 13 are connected to the emitters of the transistors 10 and 11, respectively. The second transconductance stage thus provides current feedback to the emitters of the transistors 10 and 11 and this effectively increases the resistance of the resistor 6 as described hereinbefore.

Figure 3:
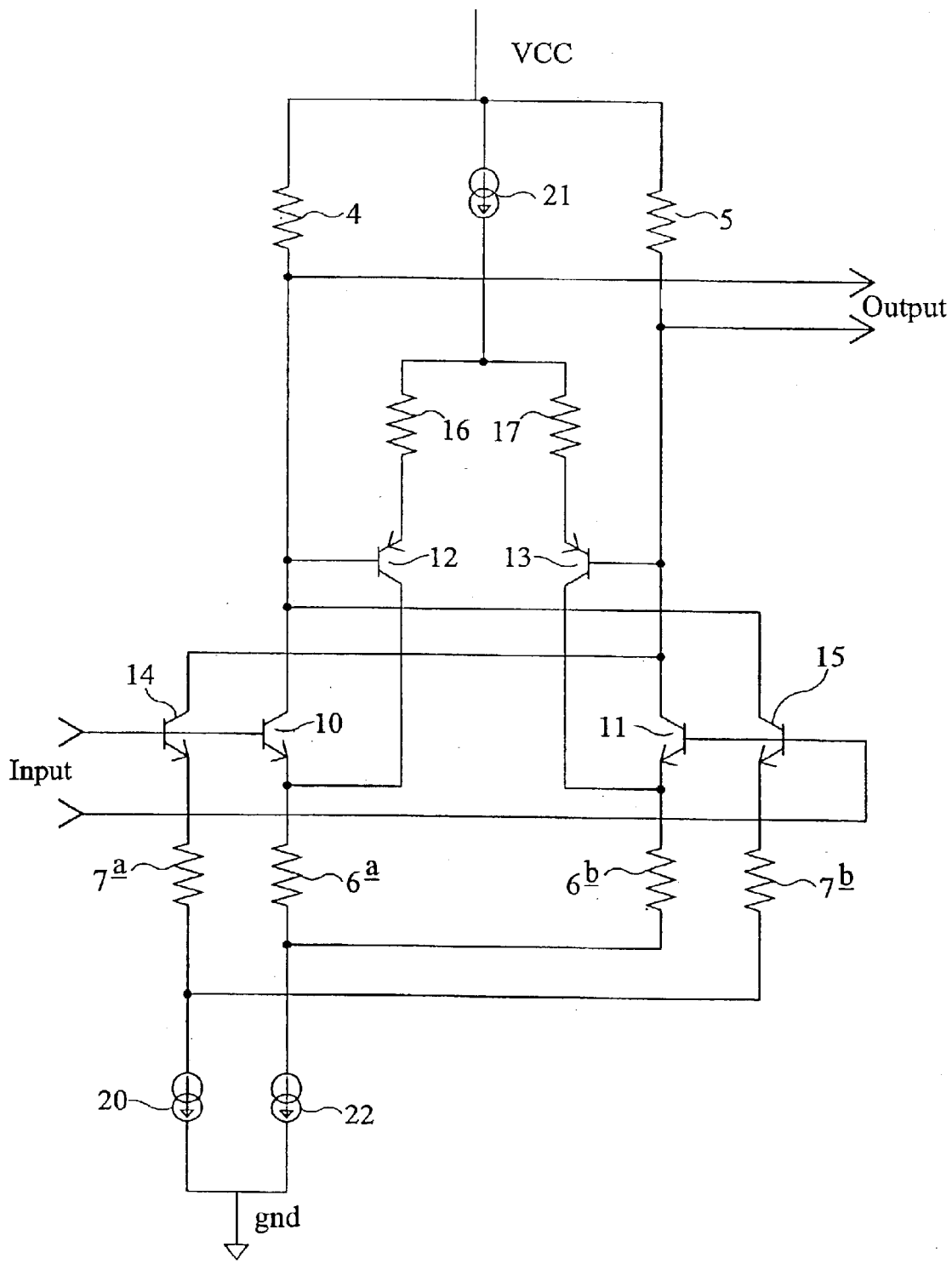
FIG. 3 is a circuit diagram of a second example of the amplifier shown in FIG. 1.

FIG. 3 shows another example of the amplifier shown in FIG. 1 which differs from the example shown in FIG. 2 in that the transistors 12 and 13 are of PNP type and the emitter degeneration resistors 16 and 17 are connected via another constant current source 21 to the positive supply line. Also, the resistor 6 in FIG. 2 is replaced by individual emitter degeneration resistors 6a and 6b which are connected via a further constant current source 22 to ground gnd. The bases of the transistors 12 and 13 do not need to be isolated at DC from the bases of the transistors 10 and 11 in the example shown in FIG. 3 so that the capacitors 18 and 19 are omitted.

What is claimed is:

1. An amplifier comprising: an amplifier input; an amplifier output; a first transconductance stage having a first input connected to said amplifier input, a current feedback input, and a first output connected to said amplifier output; a second transconductance stage having a second input connected to said amplifier output and a second output connected to said current feedback input to provide negative feedback; and a third transconductance stage having a third input connected to said amplifier input and a third output connected to said amplifier output to provide feedforward error correction.

2. An amplifier as claimed in claim 1, comprising a radio frequency amplifier.

3. An amplifier as claimed in claim 2, comprising a low noise amplifier.

4. An amplifier as claimed in claim 1, comprising a load connected to said amplifier output.

5. An amplifier as claimed in claim 1, in which each of said first, second and third transconductance stages comprises a differential transconductance stage having differential inputs and outputs.

6. An amplifier as claimed in claim 5, in which said first transconductance stage comprises first and second transistors having input terminals comprising said first input, output terminals comprising said first output, and common terminals comprising said current feedback input.

7. An amplifier as claimed in claim 6, comprising a first resistance connected between said common terminals of said first and second transistors.

8. An amplifier as claimed in claim 6, comprising respective second resistances and a first current source, said common terminals of said first and second transistors being connected via said respective second resistances to said first current source.

9. An amplifier as claimed in claim 5, in which said second transconductance stage comprises third and fourth transistors having input terminals comprising said second input and output terminals comprising said second output.

10. An amplifier as claimed in claim 9, comprising respective third resistances and a power supply line and in which said third and fourth transistors have common terminals connected via said respective third resistances to said power supply line.

11. An amplifier as claimed in claim 10, in which said third and fourth transistors are of a same conductivity type as said first and second transistors.

12. An amplifier as claimed in claim 9, comprising respective fourth resistances and a second current source and in which said third and fourth transistors have common terminals connected via said respective fourth resistances to said second current source.

13. An amplifier as claimed in claim 12, in which said third and fourth transistors are of a conductivity type opposite that of said first and second transistors.

14. An amplifier as claimed in claim 5, in which said third transconductance stage comprises fifth and sixth transistors having input terminals comprising said third input and output terminals comprising said third output.

15. An amplifier as claimed in claim 14, comprising respective fifth resistances and a third current source and in which said fifth and sixth transistors have common terminals connected via said respective fifth resistances to said third current source.

16. An amplifier as claimed in claim 14, in which said first transconductance stage comprises first and second transistors having input terminals comprising said first input, output terminals comprising said first output, and common terminals comprising said current feedback input, said input terminals of said first and second transistors being connected to said input terminals of said fifth and sixth transistors, respectively, and said output terminals of said first and second transistors being connected to said output terminals of said sixth and fifth transistors, respectively.

* * * * *